(12) United States Patent
Jallepally et al.

(10) Patent No.: US 6,773,507 B2
(45) Date of Patent: Aug. 10, 2004

(54) APPARATUS AND METHOD FOR FAST-CYCLE ATOMIC LAYER DEPOSITION

(75) Inventors: Ravi Jallepally, Santa Clara, CA (US); Shih-Hung Li, Sunnyvale, CA (US); Alain Duboust, Sunnyvale, CA (US); Jun Zhao, Cupertino, CA (US); Liang-Yuh Chen, Foster City, CA (US); Daniel A. Carl, Pleasanton, CA (US)

(73) Assignee: Applied Materials, Inc., Santa Clara, CA (US)

(*) Notice: Subject to any disclaimer, the term of this patent is extended or adjusted under 35 U.S.C. 154(b) by 164 days.

(21) Appl. No.: 10/215,068

(22) Filed: Aug. 7, 2002

(65) Prior Publication Data

US 2003/0106490 A1 Jun. 12, 2003

Related U.S. Application Data

(60) Provisional application No. 60/337,076, filed on Dec. 6, 2001.

(51) Int. Cl.[7] .............................................. C30B 25/04
(52) U.S. Cl. ............................ 117/89; 117/93; 117/98; 117/102; 117/202
(58) Field of Search .............................. 117/89, 93, 98, 117/102, 202

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,834,831 A | 5/1989 | Nishizawa et al. | 156/611 |
| 4,993,357 A | 2/1991 | Scholz | 118/715 |
| 5,225,366 A | 7/1993 | Yoder | 437/108 |
| 5,281,274 A | 1/1994 | Yoder | 118/697 |

(List continued on next page.)

FOREIGN PATENT DOCUMENTS

| | | | |
|---|---|---|---|
| EP | 1167569 | 1/2002 | C23C/16/455 |
| GB | 2355727 | 5/2001 | C23C/16/44 |
| JP | 10-82671 | 3/1989 | H01L/29/78 |
| JP | 2-014513 | 1/1990 | H01L/21/205 |
| JP | 2-230690 | 9/1990 | H05B/33/10 |

(List continued on next page.)

OTHER PUBLICATIONS

Rossnagel, et al., "Plasma–enhanced Atomic Layer Deposition of Ta and Ti for Internconnect Diffusion Barriers," J. Vac. Sci. Technol. B., vol. 18, No. 4 (Jul. 2000); p2016–20.

Ritala, M., et al., "Chemical Vapor Deposition," Jan. 1999, p. 6–9.

Ritala, et al. "Perfectly Conformal TiN and $Al_2O_3$ Films Deposited by Atomic Layer Deposition," Chem. Vap. Deposition 1999, 5, No. 1.

Ritala, et al. "Atomic Layer Deposition of Oxide Thin Films with Metal Alkoxides as Oxygen Sources," Science vol. 288 Apr. 14, 2000.

Paranjpe, et al. "Atomic Layer Deposition of $AlO_3$ for Thin Film Head Gap Applications," J. Elec. Soc., vol. 148, No. 9 Sept., 2001 pp. G465–471.

Niinisto, et al. "Synthesis of Oxide Thin Films and Overlayers by Atomic Layer Epitaxy for Advanced Applications," Materials Science and Engineering B41 (1996) 23–29.

(List continued on next page.)

*Primary Examiner*—Felisa Hiteshew
(74) *Attorney, Agent, or Firm*—Moser, Patterson & Sheridan, LLP

(57) ABSTRACT

Method and apparatus for depositing layers by atomic layer deposition. A virtual shower curtain is established between the substrate support and chamber to minimize the volume in which the reactants are distributed. A showerhead may be used to allow closer placement of the substrate thereto, further reducing the reaction volume. Zero dead space volume valves with close placement to the chamber lid and fast cycle times also improve the cycle times of the process.

39 Claims, 4 Drawing Sheets

U.S. PATENT DOCUMENTS

| | | | |
|---|---|---|---|
| 5,294,286 A | 3/1994 | Nishizawa et al. | 156/610 |
| 5,306,666 A | 4/1994 | Izumi | 437/192 |
| 5,374,570 A | 12/1994 | Nasu et al. | 437/40 |
| 5,441,703 A | 8/1995 | Jurgensen | 422/129 |
| 5,443,647 A | 8/1995 | Aucoin et al. | 118/723 ME |
| 5,443,657 A | 8/1995 | Rivenburg et al. | 118/723 ME |
| 5,480,818 A | 1/1996 | Matsumoto et al. | 437/40 |
| 5,483,919 A | 1/1996 | Yokoyama et al. | 117/89 |
| 5,503,875 A | 4/1996 | Imai et al. | 427/255.3 |
| 5,674,786 A | 10/1997 | Turner et al. | 437/225 |
| 5,711,811 A | 1/1998 | Suntola et al. | 118/711 |
| 5,796,116 A | 8/1998 | Nakata et al. | 257/66 |
| 5,807,792 A | 9/1998 | Ilg et al. | 438/758 |
| 5,835,677 A | 11/1998 | Li et al. | 392/401 |
| 5,855,680 A | 1/1999 | Soininen et al. | 118/719 |
| 5,879,459 A | 3/1999 | Gadgil et al. | 118/715 |
| 5,916,365 A | 6/1999 | Sherman | 117/92 |
| 5,923,056 A | 7/1999 | Lee et al. | 257/192 |
| 6,015,590 A | 1/2000 | Suntola et al. | 427/255.23 |
| 6,015,917 A | 1/2000 | Bhandari et al. | 556/12 |
| 6,042,652 A | 3/2000 | Hyun et al. | 118/719 |
| 6,043,177 A | 3/2000 | Falconer et al. | 502/5 |
| 6,084,302 A | 7/2000 | Sandhu | 257/751 |
| 6,124,158 A | 9/2000 | Dautartas et al. | 438/216 |
| 6,139,700 A | 10/2000 | Kang et al. | 204/192.17 |
| 6,143,659 A | 11/2000 | Leem | 438/688 |
| 6,144,060 A | 11/2000 | Park et al. | 257/310 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,200,893 B1 | 3/2001 | Sneh | 438/685 |
| 6,203,613 B1 | 3/2001 | Gates et al. | 117/104 |
| 6,207,302 B1 | 3/2001 | Sugiura et al. | 428/690 |
| 6,207,487 B1 | 3/2001 | Kim et al. | 438/238 |
| 6,231,672 B1 | 5/2001 | Choi et al. | 118/715 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 R |
| 6,306,216 B1 | 10/2001 | Kim et al. | 18/725 |
| 6,335,240 B1 | 1/2002 | Kim et al. | 438/253 |
| 6,342,277 B1 | 1/2002 | Sherman | 427/562 |
| 6,348,376 B2 | 2/2002 | Lim et al. | 438/253 |
| 6,358,829 B2 | 3/2002 | Yoon et al. | 438/597 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 438/704 |
| 6,399,491 B2 | 6/2002 | Jeon et al. | 438/680 |
| 6,416,577 B1 | 7/2002 | Suntoloa et al. | 117/88 |
| 6,416,822 B1 | 7/2002 | Chiang et al. | 427/651 |
| 6,428,859 B1 | 8/2002 | Chiang et al. | 427/457 |
| 6,447,607 B2 | 9/2002 | Soininen et al. | 117/200 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,733 B2 | 11/2002 | Raaijmakers et al. | 438/633 |
| 6,489,214 B2 | 12/2002 | Kim et al. | 438/396 |
| 6,511,539 B1 | 1/2003 | Raaijmakers | 117/102 |
| 6,534,395 B2 | 3/2003 | Werkhoven et al. | 438/627 |
| 6,551,406 B2 | 4/2003 | Kilpi | 118/728 |
| 2001/0000866 A1 | 5/2001 | Sneh et al. | 118/723 R |
| 2001/0002280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0041931 A1 | 4/2002 | Suntola et al. | 427/255.25 |
| 2002/0048635 A1 | 4/2002 | Kim et al. | 427/331 |
| 2002/0052097 A1 | 5/2002 | Park | 438/507 |
| 2002/0066411 A1 | 6/2002 | Chiang et al. | 118/724 |
| 2002/0068458 A1 | 6/2002 | Chaing et al. | 438/694 |
| 2002/0073924 A1 | 6/2002 | Chiang et al. | 118/723 R |
| 2002/0074588 A1 | 6/2002 | Lee | 257/306 |
| 2002/0076481 A1 | 6/2002 | Chiang et al. | 427/8 |
| 2002/0076507 A1 | 6/2002 | Chiang et al. | 427/569 |
| 2002/0076837 A1 | 6/2002 | Hujanen et al. | 438/3 |
| 2002/0079508 A1 | 6/2002 | Chiang et al. | 427/569 |
| 2002/0081844 A1 | 6/2002 | Jeon et al. | 438/680 |
| 2002/0086106 A1 | 7/2002 | Park et al. | 427/258.1 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomerede et al. | 438/149 |
| 2002/0104481 A1 | 8/2002 | Chiang et al. | 118/723 R |
| 2002/0106451 A1 | 8/2002 | Skarp et al. | 427/258.1 |
| 2002/0106536 A1 | 8/2002 | Lee et al. | 428/702 |
| 2002/0108570 A1 | 8/2002 | Lindfors | 118/715 |
| 2002/0115252 A1 | 8/2002 | Haukka et al. | 438/240 |
| 2002/0134307 A1 | 9/2002 | Choi | 118/715 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chaing et al. | 427/248.1 |
| 2002/0164423 A1 | 11/2002 | Chiang et al. | 427/255.28 |
| 2002/0173130 A1 | 11/2002 | Pomerede et al. | 428/592 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0196591 A1 | 12/2002 | Hujanen et al. | 360/326 |
| 2002/0197402 A1 | 12/2002 | Chiang et al. | 427/255.39 |
| 2003/0004723 A1 | 1/2003 | Chihara | 704/260 |
| 2003/0013320 A1 | 1/2003 | Kim et al. | 438/778 |
| 2003/0015764 A1 | 1/2003 | Raaijmakers et al. | 257/424 |
| 2003/0031807 A1 | 2/2003 | Elers et al. | 427/569 |
| 2003/0032281 A1 | 2/2003 | Werkhoven et al. | 438/640 |
| 2003/0042630 A1 | 3/2003 | Babcoke et al. | 261/121.1 |
| 2003/0049942 A1 | 3/2003 | Haukka et al. | 438/778 |
| 2003/0072975 A1 | 4/2003 | Shero et al. | 428/704 |
| 2003/0075273 A1 | 4/2003 | Kilpela et al. | 156/345.33 |
| 2003/0075925 A1 | 4/2003 | Lindfors et al. | 285/367 |
| 2003/0082296 A1 | 5/2003 | Elers et al. | 427/96 |

FOREIGN PATENT DOCUMENTS

| | | | |
|---|---|---|---|
| JP | 2-246161 | 9/1990 | C23C/16/40 |
| JP | 3-234025 | 10/1991 | H01L/21/318 |
| JP | 4-291916 | 9/1992 | C23C/16/48 |
| JP | 5-029228 | 2/1993 | H01L/21/205 |
| JP | 5-047666 | 2/1993 | H01L/21/205 |

| | | | | |
|---|---|---|---|---|
| JP | 5-074724 | 3/1993 | ......... | H01L/21/205 |
| JP | 5-206036 | 8/1993 | ......... | H01L/21/205 |
| JP | 5-234899 | 9/1993 | ......... | H01L/21/205 |
| JP | 5-270997 | 10/1993 | ........... | C30B/29/68 |
| JP | 6-224138 | 5/1994 | ........... | C23C/16/00 |
| JP | 6-177381 | 6/1994 | ......... | H01L/29/784 |
| JP | 6-230421 | 8/1994 | ........... | G02F/1/136 |
| JP | 7-286269 | 3/1999 | ......... | H01L/21/314 |
| JP | 11-269652 | 10/1999 | ........... | C23C/16/44 |
| JP | 2000-031387 | 1/2000 | ........... | H01L/27/04 |
| JP | 2000-058777 | 2/2000 | ......... | H01L/27/108 |
| JP | 2000-319772 | 3/2000 | ........... | C23C/16/00 |
| JP | 2001-020075 | 11/2000 | ........... | C23C/16/44 |
| JP | 10-308283 | 3/2001 | ........... | H05B/33/22 |
| JP | 2001-111000 | 4/2001 | ......... | H01L/27/105 |
| JP | 2001-1172767 | 6/2001 | ........... | C23C/16/40 |
| JP | 2001-220294 | 8/2001 | ........... | C30B/29/20 |
| JP | 2001-328900 | 11/2001 | ........... | C30B/29/68 |
| WO | 96/17107 | 6/1996 | ........... | C23C/16/44 |
| WO | 99/01595 | 1/1999 | ........... | C30B/25/14 |
| WO | 99/29924 | 6/1999 | ........... | C23C/16/04 |
| WO | 99/65064 | 12/1999 | ........... | H01L/21/00 |
| WO | 00/16377 | 3/2000 | | |
| WO | 02/45167 | 6/2000 | ........... | H01L/27/00 |
| WO | 00/54320 | 9/2000 | ........... | H01L/21/44 |
| WO | 00/79576 | 12/2000 | ......... | H01L/21/205 |
| WO | 02/08485 | 1/2001 | ........... | C23C/16/00 |
| WO | 01/15220 | 3/2001 | ......... | H01L/21/768 |
| WO | 01/17692 | 3/2001 | ........... | B05C/11/00 |
| WO | 01/27346 | 4/2001 | ........... | C23C/16/44 |
| WO | 01/27347 | 4/2001 | ........... | C23C/16/44 |
| WO | 01/29280 | 4/2001 | ........... | C23C/16/32 |
| WO | 01/29891 | 4/2001 | ......... | H01L/21/768 |
| WO | 01/29893 | 4/2001 | ......... | H01L/21/768 |
| WO | 01/36702 | 5/2001 | ........... | C23C/16/00 |
| WO | 01/66832 | 9/2001 | ........... | C30B/25/14 |
| WO | 02/08488 | 1/2002 | ........... | C23C/16/44 |
| WO | 02/31875 | 4/2002 | ......... | H01L/21/316 |
| WO | 02/43115 | 5/2002 | | |
| WO | 02/065525 | 8/2002 | ......... | H01L/21/28 |
| WO | 02/067319 | 8/2002 | ......... | H01L/21/768 |

OTHER PUBLICATIONS

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of $\{Nb_{1-x}Ta_x\}_2O_5$ Solid Solutions and $\{Nb_{1-x}Ta_x\}_2O_5$–$ZrO_2$ Nanolaminates Gorwn by Atomic Layer Epitaxy," 1997; p. 785–93.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

Kukli, et al., "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Hwang, et al. "Nanometer–Size $a$–$PbO_2$–type $TiO_2$ in Garnet: A Thermobarometer for Ultrahigh–Pressure Metamorphism," Science Vo. 288 (Apr. 14, 2000).

George, et al. "Surface Chemistry for Atomic Layer Growth," J. Phys. Chem. 1996 100, 13121–13131.

George, et al. "Atomic Layer Controlled Depositon of $SiO_2$ and $Al_2O_3$ using ABAB . . . binary reaction sequence chemistry," Applied Surface Science 82/83 (1994) 460–467.

Applied. Phys. Lett. 71 (25), Dec. 22, 1997 (3604–6).

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Chang–Wook, et al. "Plasma–assisted Atomic Layer Growth of High–Quality Aluminum Oxide Thin Films," Jpn. J. Appl. Phys. 1, vol. 40, No. 1, Jan. 2001 pp. 285–289.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Chang–Wook, et al. "Growth and Characterization of Aluminum Oxide ($Al_2O_3$) Thin Films by Plasma–Assisted Atomic Layer Controlled Deposition," J. Korean Inst. Met. Mater., vol. 38, No. 10, Oct. 2000 pp. 1395–1399.

APPARATUS AND METHOD FOR FAST-CYCLE ATOMIC LAYER DEPOSITION

CROSS-REFERENCE TO RELATED APPLICATIONS

This application claims benefit of U.S. Provisional Patent Application Ser. No. 60/337,076, entitled "Apparatus and Method For Fast-Cycle Atomic Layer Deposition," filed Dec. 6, 2001, which is herein incorporated by reference.

BACKGROUND OF THE INVENTION

1. Field of the Invention

The present invention relates to the field of thin film technology for coating substrates and has particular application to atomic layer deposition.

2. Description of the Related Art

In the field of thin film technology, requirements for thinner deposition layers, better uniformity over increasingly larger area substrates (e.g., ever increasing substrate sizes in flat panel technology as well as the move to 300 mm technology in semiconductor manufacturing), larger production yields, and higher productivity have been, and still are, the driving forces behind emerging technologies developed for coating substrates in the manufacture of various semiconductor devices. Various technologies known in the art exist for applying thin films to substrates, including sputtering or physical vapor deposition (PVD), chemical vapor deposition (CVD) and atomic layer deposition (ALD) methods.

According to the sputtering or PVD method, an inert gas such as argon (Ar), is injected into a vacuum chamber in which high voltage is applied to a target to generate Ar ions in a plasma state. Then, Ar ions are attracted onto the surface of the target such that atoms of the target become dislodged and are deposited onto the surface of the substrate. Although high purity thin films with good adhesion to the substrates can be formed by the sputtering method, it is difficult to ensure uniformity over the entire thin film.

In the CVD method, a desired layer is deposited on a substrate to a desired thickness using decomposition and reaction of gases. First, various gases are injected into a reaction chamber, and chemical reactions between the gases are induced with high energy such as heat, light, or plasma to deposit a thin film having a predetermined thickness on the substrate. The deposition rate of CVD can be increased by controlling either the amount and ratio of the gases or the reaction condition of heat, light, or plasma supplied as the reaction energy. The reactions are so rapid, however, that it is difficult to control the thermodynamic stability of atoms. Another problem is that the close proximity of the reactant and the products of reaction to the deposition surface creates a high probability of the inclusion of reaction products and other contaminants in each deposited layer.

Forming and growing thin films by ALD is based on the principle of the formation of a saturated monolayer of reactive precursor molecules by chemisorption at the deposition surface of the substrate. In ALD, appropriate reactive gaseous precursors are alternately pulsed or injected into a reaction chamber. Each pulse or injection of a reactive precursor is separated by an inert gas purge. The precursor injections react on the surface of the substrate to form a new atomic layer with each full cycle of the process. Thus, atomic layers are built up one over the other in a repetitive process to form a uniform solid layer of film. Each set of process steps performed to form an atomic layer is referred to as a cycle. The repetitive process is repeated for a number of cycles needed to form the desired film thickness.

An essential difference between ALD and other deposition methods is that film growth proceeds stepwise, atomic plane by atomic plane, resulting from a surface reaction between one component element in the gas phase with the other as surface atoms in the growing compound film. As a result, the ALD method achieves improved step coverage and allows for improved control over the thickness and composition of the grown thin film. ALD, although a slower process than CVD, demonstrates a remarkable ability to maintain ultra-uniform thin deposition layers over complex topography.

The unique mechanism of film formation provided by ALD offers several advantages over CVD and other thin film technologies. One advantage is the transparency of ALD to substrate size. For example, a 200 mm substrate will receive a uniform layer equal in thickness to one deposited on a 100 mm substrate processed in the same reactor chamber because of the self-limiting chemisorption phenomena described above. Another distinct advantage of the ALD process is the avoidance of high reactivity of precursors toward one another because chemical species are injected independently into an ALD reactor rather than together. High reactivity, while problematic in some CVD methods, is exploited to an advantage in ALD because the reaction occurs directly on the substrate surface. This high reactivity enables lower reaction temperatures and simplifies process chemistry development. Yet another distinct advantage of ALD is that surface reaction by chemisorption contributes to improved step coverage over complex topography.

A thin film having a high aspect ratio, good uniformity and good electrical and physical properties can be formed by ALD. Moreover, the films deposited by ALD have a lower impurity density than those formed by other deposition methods, and a film thickness of less than about 200 Angstroms with sufficient thickness uniformity that can be obtained with reproducibility. ALD, therefore, is a superior method for achieving uniformity, excellent step coverage, and transparency to substrate size.

While the ALD method can provide a thin film with a high aspect ratio, good uniformity, good electrical, and physical properties, it is problematic in that it has been difficult to create an acceptable commercial process (i.e., one with adequate system throughput) because of the separate deposition of each film layer and the low deposition rate of the process (e.g., typically about 100 Angstroms per minute as compared to about 1,000 Angstroms per minute for CVD). The deposition rate may be increased by increasing the number of deposition cycles per unit time. Thus, there remains a need for improved apparatus and processes for decreasing the overall time to deposit a film by ALD, thereby increasing the overall throughput of products employing layers deposited by ALD.

SUMMARY OF THE INVENTION

In certain embodiments, the present invention includes an apparatus for forming a layer on a substrate by atomic layer deposition. In order to commercialize such a process, cyclical steps are performed rapidly due to the large number of atomic layers that generally need to be deposited to achieve the desired thickness of the final product layer. The apparatus of the present invention includes a chamber and a lid that define a reaction chamber therein. A substrate support, such as a heater, supports the substrate in the reaction chamber. The top surface for the substrate support forms a dividing line that, in combination with a virtual shower curtain and walls of the chamber or liner or shadow ring, divides the reaction chamber into a first volume and a second volume or top and bottom volume.

In some embodiments, the virtual shower curtain may be established by providing at least one port through the chamber through which a vacuum may be applied, where upon application of vacuum to the at least one port, a bottom purge of the substrate support is performed and the virtual shower curtain is established between the top surface of the substrate support and the chamber wall, liner or shadow ring, to prevent flow from the top volume to the bottom volume.

In other embodiments, a high conductance showerhead may be mounted to the lid to allow closer positioning of the substrate to the showerhead, compared to use of a standard showerhead. This reduces the volume of the effective reaction chamber, further reducing step and cycle times. A high conductance showerhead described includes at least one distribution hole having a diameter of at least ⅛". Spacers may also be provided to form a gap between the high conductance showerhead and the lid upon mounting. This gap defines flow pathways for horizontally flowing a reactant and distributing it peripherally about the substrate.

In yet other embodiments, a gas valve mounted on top of the lid of the apparatus may also be designed to reduce step and cycle times. A pair of gas valves may be mounted immediately adjacent the lid to minimize dead volume in flow paths connecting the valves with the showerhead/reaction chamber. The valves may also be mounted flush against the lid, by any variety of techniques or components including welding, threading, or using other attachment methods to attach the valves to the lid or by using screws or other fastening devices to mount the valves on the lid.

In some embodiments, the valves may be ZDV valves, and may be pneumatic valves, solenoid valves or piezo valves. MEMS technology significantly reduces the valve cycle times of the valves used. "MEMS" is an acronym used herein to mean "micro electro-mechanical system".

In other certain embodiments, an apparatus for forming a layer on a substrate by atomic layer deposition is described herein to include a chamber and a lid which define a reaction chamber therein. A high conductance showerhead is mounted to the lid and has at least one hole having a diameter of at least about ⅛" for distributing gas therethrough and into the reaction chamber and allowing closer placement of the substrate with regard thereto. A substrate support is provided for supporting the substrate and, together with the formation of a virtual shower curtain, divides the reaction chamber into a first volume and a second volume, the first volume being defined above the top surface of the substrate support and the second volume being below the top surface. At least one port is provided, through which a vacuum may be applied. Upon application of the vacuum, a bottom purge of the substrate support is performed and a virtual shower curtain is established between the top surface of the substrate support and the chamber wall, liner or shadow ring to prevent flow from the first volume to the second volume.

In some embodiments, fast cycle valves may be mounted on top of the lid and fluidly connected with the high conductance showerhead. Each valve may be operated to a valve cycle time of less than about 400 msec. Of course, the fast cycle valves may be operated to a valve cycle time of about 400 msec or more.

In yet other certain embodiments, a method of reducing an amount of time needed to form a film on a substrate by atomic layer deposition is described to include positioning the substrate on a substrate support in a reaction chamber; establishing a virtual shower curtain between the substrate support and walls of the reaction chamber, thereby dividing the reaction chamber into an upper volume above the substrate support and the virtual shower curtain, and a lower volume, below the substrate support and the virtual shower curtain; and distributing a reactant into the upper volume, wherein the virtual shower curtain prevents the reactant from flowing into the lower volume.

In some embodiments, the distributing step may be initiated by turning on a valve connecting a source of the reactant with the reaction chamber, wherein the valve is turned on in less than about 400 msec. Of course, the valve may be turned on in about 400 msec or more.

In other embodiments, the distribution may include flowing the reactant through a showerhead having at least one distribution hole having a diameter of at least ⅛".

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
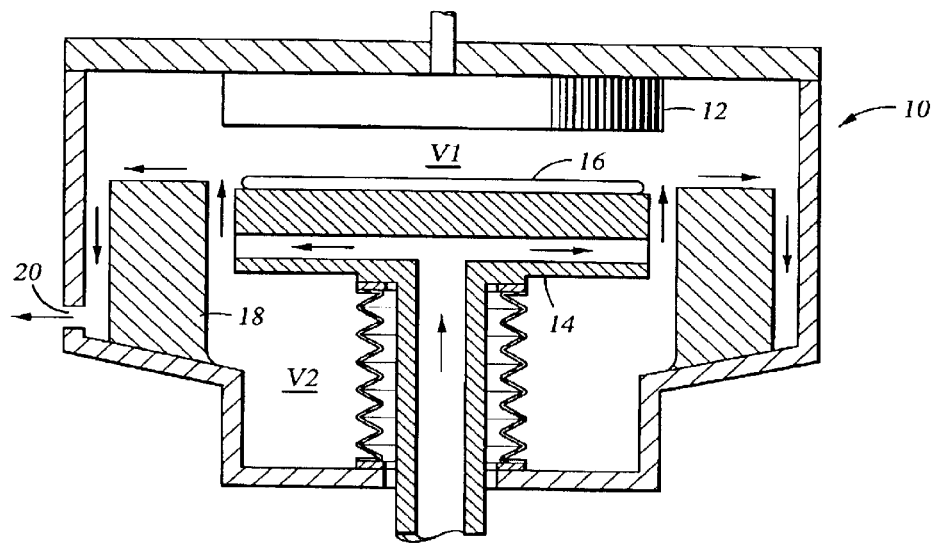
FIG. 1 is a schematic cross-sectional view of one embodiment of an apparatus for performing ALD processing.

Before the present apparatus and methods are described, it is to be understood that this inventions not limited to particular embodiments described, as such may, of course, vary. It is also to be understood that the terminology used herein is for the purpose for describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limiting the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that as used herein and in the appended claims, the singular forms "a", "and", "the" include plural referents unless the context clearly dictates otherwise. Thus, for example, reference to "a stream" includes a plurality of such streams and reference to "the valve" includes reference to one or more valves and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different form the actual publication dates which may need to be independently confirmed.

DEFINITIONS

"ALD" is an acronym used for "atomic layer deposition"

"ZDV valve" as used herein, is a "zero dead volume" valve in which valve seats are situated very close to the gland of the valve, so that very little purging is necessary.

"Valve cycle time", or response time as used herein, is defined as the time it takes to reposition a valve from one to another of available settings; to turn the valve from "on" to "off" or from a setting directing a reactant to the chamber to a setting directing a purge gas to the chamber, for example.

"MEMS" is an acronym used herein to mean "micro electro-mechanical system".

The terms "substrate surface" and "surface of the substrate" refer to the surface of the substrate that is exposed to the gas or vapor-phase reactant flowing into the reaction chamber. Thus, in an ALD process, the substrate surface may include one or more layers of the film currently being deposited, which were deposited in previous cycles of the current ALD process. The substrate surface may also be a film/layer previously deposited on the "substrate," such as a dielectric layer, metal layer, etc.

The term "valve mounted to the lid" includes a valve mounted immediately adjacent the lid to minimize dead volume in flow paths connecting the valve with the showerhead/reaction chamber, and preferably includes a valve mounted flush against the lid.

FIG. 1 is a schematic cross-sectional view of one embodiment of an apparatus 10 for performing ALD. The apparatus 10 includes a vacuum or reaction chamber which is defined by the walls of the apparatus 10 as well as a lid sealing with the top of the walls. An arrangement (not shown in FIG. 1) is generally mounted on top of the apparatus 10 for supplying various gases, liquid vapors, and/or vaporized solids through a showerhead 12 to be distributed into the chamber for treatment of a substrate surface. The gas supplying arrangement is also provided to supply at least one purging gas to the reaction chamber.

A substrate support or heater 14 which includes a horizontal support (i.e. a substrate receiving surface) adapted to support a substrate 16 and a column which may or may not be integrally formed with the horizontal support is arranged for vertical movement with respect to the chamber of apparatus 10. Heater 14 may be formed of aluminum or ceramics, for example. When loading or unloading a substrate 16, heater 14 is moved downwardly with respect to the chamber so as to provide a larger space between the substrate 16 and the showerhead 12 and so as to align the substrate with a robot door (not shown). Upon aligning the substrate 16 with the robot door, the robot door opens to allow access by a robot to remove the existing substrate 16 and/or to load a new substrate 16. After loading/unloading, the robot door closes and the heater 14 moves upward to place the substrate into a processing position, as shown in FIG. 1. Alternatively, the substrate 16 may be heated using radiant heat, such as by lamps.

One embodiment of a deposition sequence making up a cycle in a ALD deposition process includes the following four steps, for example: (1) a first step comprising providing a pulse of a first reactant to the substrate 16; (2) a second step comprising providing a purge gas; (3) a third step comprising providing a pulse of a second reactant to the substrate; and (4) a fourth step comprising providing a purge gas. Reactants can be compounds, reductants, oxidizing agents, precursors, catalysts, and mixtures thereof. The second step and the fourth step may provide the same or different purge gas. Examples of purges gases that may be used $N_2$, Ar, He, $H_2$, combinations thereof, or other nonreactive or inert gas or gas combinations known and used for such purpose. Not wishing to be bound by theory, it is believed that when the first reactant is provided to the substrate, the first reactant is chemisorbed onto the surface of the substrate 16. The second reactant is provided to the substrate to react with the first reactant chemisorbed on the surface of the substrate 16 to form a thin layer of material. The purge gas between the pulse of the first reactant and the pulse of the second reactant separates the pulses of the reactants and reduces the gas phase reactions between the reactants. The purge gas may be provided as a continuous flow in which the pulses of the reactants are dosed into the continuous flow or the purge gas may be provided in pulses. These steps are repeated until the desired thickness of the film is obtained. In other words, the thickness of the film can be adjusted according to the number of repetitions of steps (1)–(4).

Since the layer to be deposited by ALD is built up one atomic layer at a time with each cycle, it is not unusual for the process to require many cycles to obtain the desired thickness in a layer being deposited. To make such a process economically feasible with regard to production throughput, it becomes critical to reduce the length of time required by each of the steps in each cycle. In reference to FIG. 1, a reduction of the processing volume V1 reduces the amount of time required to fill the space with a sufficient volume of reactant to be chemisorbed (step 1) and/or to react (step 3) with a co-reactant on the surface of the substrate. Additionally, the purge steps (steps 2 and 4) can be significantly shortened by arranging a chamber such as according to the present invention, where the reactants are confined substantially to the reaction volume (volume V1). Reaction volume is defined as the volume in which the reactant gases/purge gases occupy as the reactant gases/purge gases flow from the showerhead 12 to a vacuum port 20. In prior art arrangements, reactants pass between the substrate 16/heater 14 and the chamber walls or chamber liner walls 18, to also occupy the larger volume V2 beneath the heater 14. Not only does this require a greater volume of reactant to be distributed in each of steps 1 and 3, but even more significantly this situation requires a larger volume of purge gas and longer purge times to purge the reactants and by-products in steps 2 and 4.

The present invention provides a bottom purge feature which is preferably operative during the process sequence of steps 1, 2, 3, and 4, so that when reactants are being distributed from the showerhead 12 to the surface of the substrate 16, a virtual shower curtain is established to effectively prevent the reactants from passing between the heater 14 and liner 18 (or chamber wall if no liner is used). This effectively constrains the volume that the reactant is contained in to volume V1, which reduces the time for performing each of steps 1–4. Not only does the virtual shower curtain reduce the volume of reactants, by-products, etc. to be purged in steps 2 and 4, but the virtual shower curtain also substantially prevents reactions from occurring in the chamber volume V2 below the heater, thereby facilitating decontaminate during the purging steps. Also, the virtual shower curtain reduces the times for purges performed (steps 2 and 4) since the purge gas from the showerhead 12 is contained in volume V1. The purging of the entire chamber is performed with a bottom purge, during which a vacuum is drawn through the port(s) 20 to evacuate the chamber.

While delivering reactants to the substrate during steps 1 and 3, the virtual shower curtain may be established by drawing a vacuum through port(s) 20, for example. The heater 16 may be provided with one or more channels through both the horizontal support and the vertical support so that vacuum flow proceeds as indicated by the arrows in FIG. 1. The relatively high velocity flow (for example, flow rates of about 100 to 500 sccm in a TanOx Xz chamber, although these numbers will vary with according to variations in the volume of the chamber being used) of an inert purging gas (e.g., nitrogen and/or argon) through the gap between the heater/substrate 14, 16 and the liner 18 or shadow ring (which may be formed with the liner 18) or chamber wall, cause a venturi effect that prevents flow of reactants into volume V2 while keeping them in the volume V1, with some small amount of purging of the same via port(s) 20.

Another way of shortening the cycle times for ALD is to reduce the reaction volume V1, in which the processing steps are carried out. Preferably, the reaction volume V1 between the showerhead 12 and the substrate support 14 is less than about 1.0 L, more preferably less than about 0.6 L, for a substrate support 14 adapted to support a 200 mm diameter substrate and is less than about 2.25 L, more preferably less than about 1.35 L, for a substrate support 14 adapted to support a 300 mm diameter substrate. By reducing the size of volume V1, this also reduces the amount of time required, at any given flow rate, to fill the volume with a reactant for carrying out a processing step. Further, as noted above with regard to volume V2, a reduction in the volume V1 also reduces the amounts of purging gas that are required during a purging step to purge a reactant from the volume V1 prior to going forward with another processing/reaction step. Thus, for any given flow rate of purge gas, a reduction in the volume V1 reduces the amount of time required to purge that volume of reactants/by-products. Additionally, by maximizing rates of conductance in all flow paths for reactants as well as purging gases used in the process, this will reduce the amount of time needed to complete each step since the purging gas or reactant can be delivered in a sufficient amount in less time relative to a set up with slower conductance pathways.

One critical area for improving conductance pathways is in the showerhead 12. Conductance forms an inverse relationship with resistance, so an objective is to reduce the resistance build up within the showerhead. To achieve a reduction in resistance a reduction in surface contact between the reactant or purging gas and the surfaces of the showerhead needs to be achieved. For a pipeline (e.g. a conductance pathway in a showerhead), conductance increases to the fourth power as a function of increase in diameter of the pipeline, i.e., $C \% d^4$. Therefore, by increasing the size or diameter of the cross-sections of the flow pathways in the showerhead, increased conductance can be achieved. However, a countervailing consideration is the concern for controlling how fast the gas expands in the showerhead, and the distribution of the reactant over the surface of the substrate 16 as it exits the showerhead. It is noted that the desire to minimize volume V1 by moving the substrate surface 16 as close as possible to the showerhead 12, in some configurations, may also countervail against even distribution of the reactant by the showerhead 12 over the surface of the substrate 16.

A showerhead used in a CVD process will typically contain 1000 or more distribution holes of about 0.008" to 0.032" diameter for example. Such a design, while providing good distribution patterns for CVD, also provides a considerable amount of resistance to flow therethrough, and pump down times to reach operating pressures and flows is not insignificant for purposes of ALD cycling. The present invention substantially reduces the resistance in the showerheads used to greatly reduce the pump down time, as well as the time to deliver reactants and/or purge gas from the showerhead 12, while also allowing a reduction in the processing volume V1.

Figure 2:
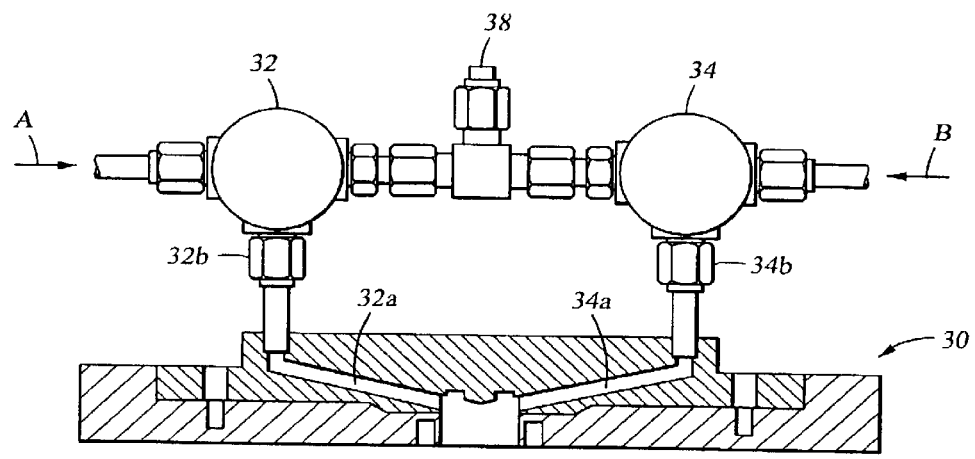
FIG. 2 is a schematic cross-sectional view of one embodiment of a top lid arrangement for ALD processing.

FIG. 2 is a schematic cross-sectional view of one embodiment of a top lid arrangement 30 for ALD processing. As mentioned above, a top lid 30 seals with the chamber 10 to provide the processing environment therein. The showerhead 12 mounts to the underside of the top lid 30 and receives reactants as well as one or more purge gases that are conveyed through the flow paths 32a, 34a in the top lid 30 when one or both of valves 32, 34 are opened.

Figure 3:
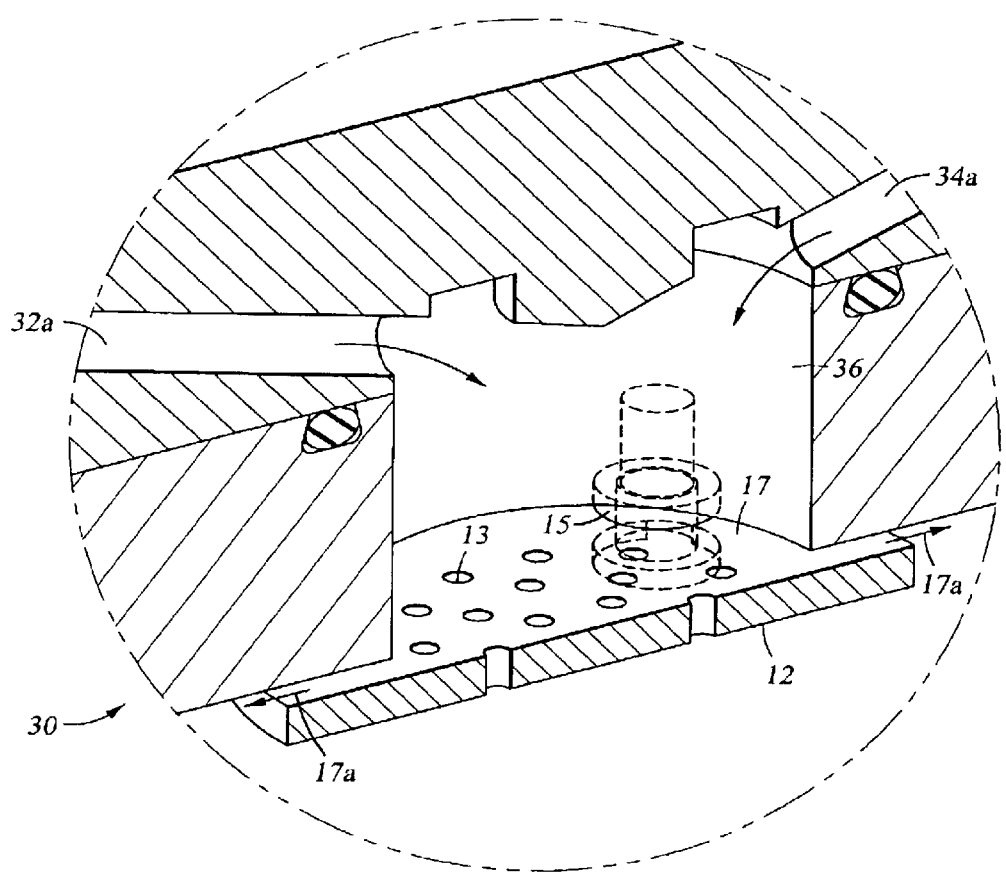
FIG. 3 is a schematic cross-sectional perspective view of another embodiment of a top lid and a showerhead mounted thereto.
Figure 4:
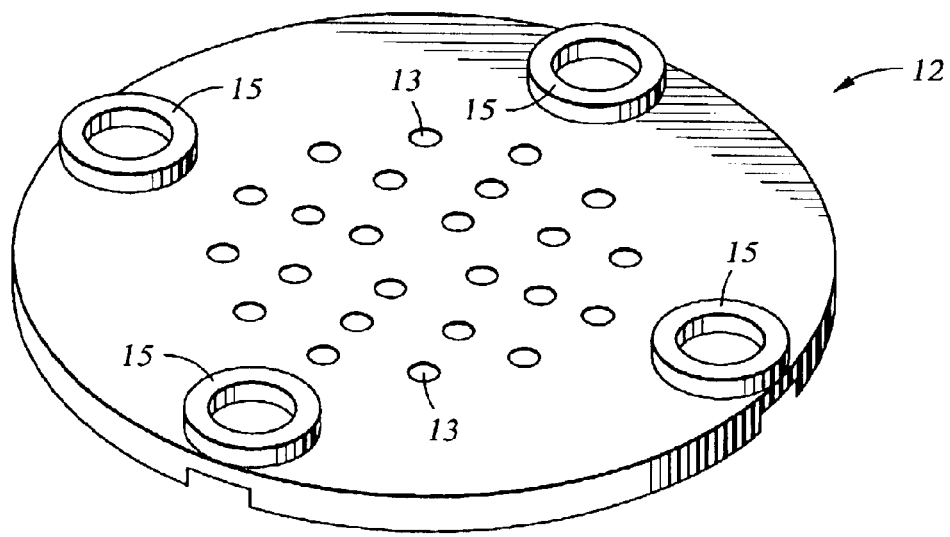
FIG. 4 is a perspective view of another embodiment of a showerhead.

FIG. 3 is a schematic cross-sectional perspective view of another embodiment of a top lid 30 and a showerhead 12 mounted thereto. Showerhead 12 employs a high conductance design in which a fewer number of holes 13 are employed, but each having a significantly greater diameter than the prior art holes described above. For example, holes 13 may have a diameter ranging from about ⅛" to about ⅜". Holes 13 generally all have the same diameter, although this is not necessary. Additionally, spacers 15 (see also FIG. 4) are provided on showerhead 12 to prevent a fluid-tight seal of the showerhead against the top lid 30, thereby forming a gap 17 of up to about 200 mils, more preferably about 100 to 200 mils, through which reactant/purge gas can flow. Thus, not only does the gas flow through holes 13 to be distributed on the substrate surface 16, but it also flows radially, in the directions of arrows 17a in FIG. 3, and also in all radial directions outwardly to the circumference of the showerhead 12 which aids in the distribution of reactants at the peripheral regions of the substrate surface 16. Gap 17 not only reduces the resistance to flow of the reactant or purge gas into volume V1, but it also allows a reduction in the volume V1 as the substrate 16 can be moved relatively closer (e.g., to leave a spacing of about 200 to 400 mils) to the showerhead 12 while the showerhead still maintains the ability to adequately distribute reactant over the entire surface of the substrate 16, since the gap 17 broadens the effective range of distribution area at close distance, compared to a showerhead having no such pathways defined by a gap. Additionally, by directing some of the flow horizontally, gap 17 reduces vertical velocity of the gas being delivered to reduce the likelihood of blowing off reactants chemisorbed on the surface of the substrate 16.

Figure 5:
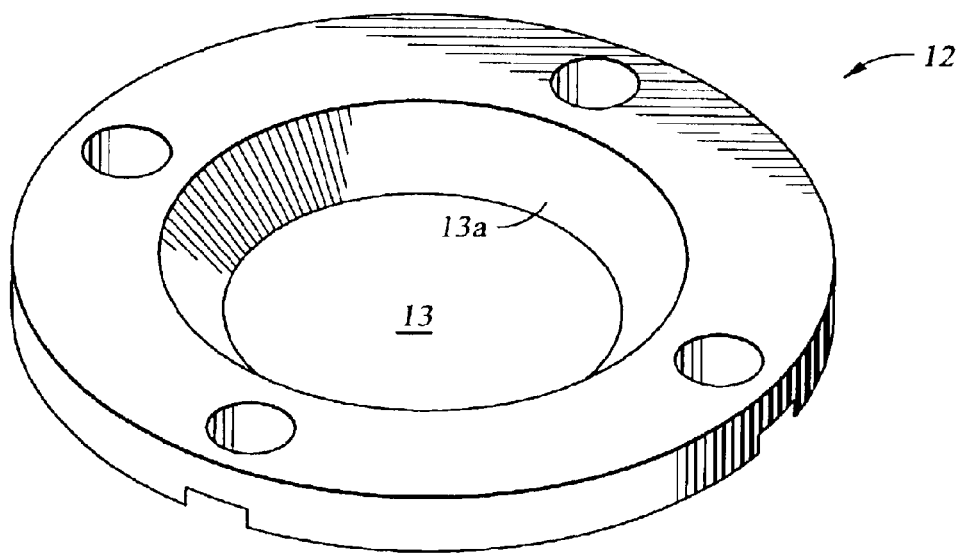
FIG. 5 is a perspective view of another embodiment of a showerhead.

FIG. 5 is a schematic perspective view of another embodiment of a showerhead 12 having a single, large open bore or hole 13, which, when mounted to the top lid 30 aligns with delivery bore 36 (FIG. 3). As shown in FIG. 5, bore 13 has a somewhat smaller diameter than bore 36 and is provided with a taper 13a where the two meet. However, the bore 13 may be made as large as the bore 36. Bore 13 is typically made to have a diameter of about 2 to 6 inches. This showerhead provides a very direct, high conductance throughput of reactant/purge gas, although distribution of reactants to the periphery of the substrate surface 16 may not be as uniform as with the showerhead shown in FIG. 4, particularly for extremely large substrates.

Figure 6:
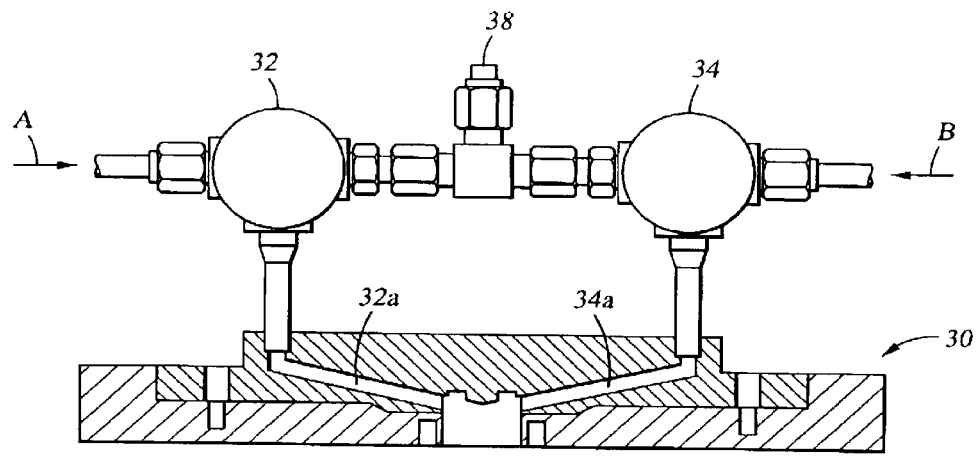
FIG. 6 is a schematic view of one embodiment of valves mounted flush to the top lid.

Referring again to FIG. 2, valves 32 and 34 are mounted to the top lid 30. In one embodiment, the valves 32 and 34 are mounted to the top lid 30 leaving enough space to allow sufficient travel for nuts 32b, 34b to be unthreaded off of the respective valves for servicing/replacement of the valves. Whether the valves 32 and 34 are mounted immediately adjacent the top lid 30 or mounted flush to the top lid 30, the distance between the valves and the volume V1 is minimized and the volume of gas left in either flow path 32a or 34a is reduced. Therefore, the amount of purging gas that needs to be flowed though the flow paths during a purging step is reduced, thereby making it possible to reduce the time of those steps. The shortened distances also make it possible to fill the volume V1 with a reactant in less time during the reaction process steps. Thus, the pulses times of the reactants (for example, steps 1 and 2) and/or purge times (for example, steps 3 and 4) may be minimized. FIG. 6 shows an arrangement in which valves 32 and 34 are mounted flush to the top lid 30, which still further decreases the "dead space" or "dead volume" in the flow paths 32a and 34a between the vales 32 and 34 and the volume V1, respectively.

In either case, the valves are arranged to introduce the reactants into the reaction volume V1 to carry out the ALD process. For example, valve 32 may be connected with a source of a first reactant A and valve 34 may be connected with a source of a second reactant B. As described above, a first step of the cycle is carried out by flowing the reactant A into the volume V1 where it is saturatively chemisorbed at the surface of the substrate 16. Thus, for carrying out the first step, valve 32 is opened to allow flow of reactant A to volume V1 though pathway 32a and through the showerhead 12. At the same time, as also described above, a vacuum is applied through port/ports 20 to perform a bottom purge forming the virtual shower curtain to contain the reactant A in volume V1. The reactant used as reactant A may vary as the process may be used to deposit various types of layers by ALD. For example, a high k dielectric layer such as $Ta_2O_5$ may be deposited in which case reactant A may be TAETO (tantalum pentaethoxide) or TBTDET (tertiarybutylamino tris(diethylamino) (tantalum), or other known precursors for the formation of tantalum pentoxide, for example. Other high k dielectric layers may be formed by the process according to the present invention, including, but not limited to zirconium oxides (e.g., $ZrO_2$), hafnium oxides (HfOx), lanthanum oxides (LaOx), barium strontium titanates (BST), strontium bismuth tantalates (SBT) and lead zirconium titanates (PZT); using precursors known for forming such layer. Still further, other layers such as $Al_2O_3$ or composite layers including $Al_2O_3$ and tantalum pentoxide, for example may be formed using the present apparatus and processes. For the formation of an $Al_2O_3$ layer, a good non-pyrophoric reactant A was found to be di-methyl aluminum hydroxide-ligand (DMAH-L) although other known precursors may be used for reactant A in forming an $Al_2O_3$ layer. For the formation of a $Ta_2O_5$ layer or a $Al_2O_3$, reactant B may be ozone, for example, or other reactive oxygen containing species such as atomic oxygen from a plasma from ozone gas ($O_3$), oxygen gas ($O_2$), water vapor ($H_2O$), other suitable gases and combinations thereof.

Figure 7:
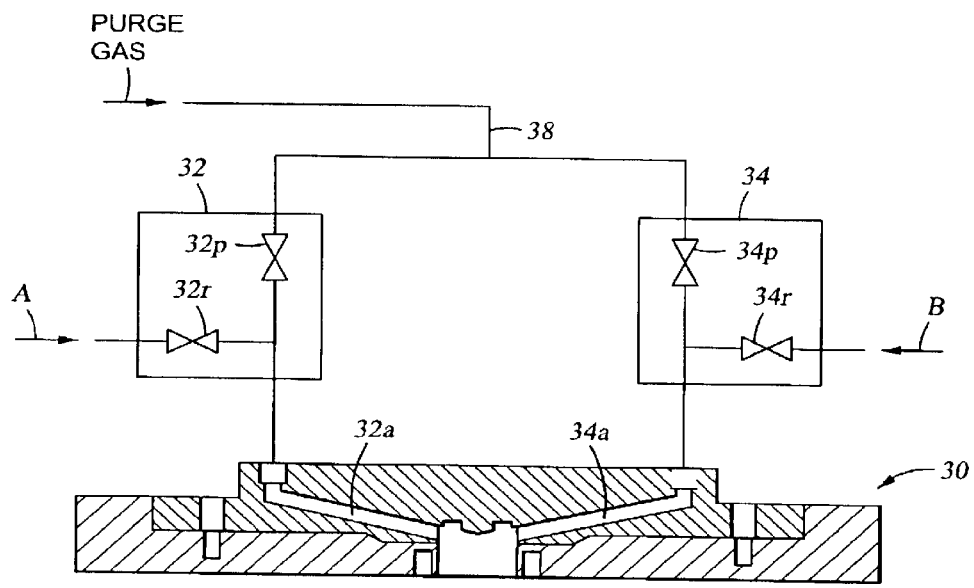
FIG. 7 is a schematic view of the valve seats of the valves of FIG. 2.

It is noted that each of valves 32 and 34 may be operated in a number positions which may be better understood by reference to FIG. 7 which shows a schematic arrangement of valves 32 and 34. Valve 32 may have a valve seat 32r for controlling the flow of a reactant gas A and may have a valve seat 32p for controlling the flow of a purge gas. Valve 34 may have a valve seat 34r for controlling the flow of a reactant gas B and may have a valve seat 34p for controlling the flow of a purge gas. Valve seat 32r may be opened and closed to provide pulses of the reactant gas A. Valve seat 34r may be opened and closed to provide pulses of the reactant gas B. Valve seat 32p and/or valve seat 34p may be opened and closed to provide a purge gas into the chamber. In one aspect, the valve seat 32p and/or valve seat 34p may be opened and closed to provide pulses of the purge gas.

For example, during the first step of the cycle, valve seat 32r is opened to introduce a pulse of reactant A. After a predetermined time to allow saturative chemisorption of reactant A on the surface of substrate 16, the time for which varies depending upon the type of reactant being distributed and the volume V1, valve seat 32r is closed thereby preventing any further flow of reactant A into flowpath 32a. Then, in a second step, valve seat 32p and/or valve seat 34p is opened to introduce a purge gas from flowpath 38 to flow pathways 32a and/or 34a. Flowpath 38 provides a common purge gas source to valves 32 and 34. A common purge gas source instead of two separate purge sources to the valves simplifies the gas delivery apparatus. A bottom purge may be conducted simultaneously while valve 32 and/or valve 34 is being purged (i.e. the top purge). Purge gases used in performing the top and bottom purges are evacuated through port(s) 20. Preferably, both valve seat 32p and valve seat 34p are open to purge their associated flowpaths during the second step since there is a potential for backflow of reactant A into flowpath 34a. Further, without flow of the purging gas through flowpath 34a during this purging step, it would also be possible for some of the reactant A being purged to be driven into the flowpath 34a. Examples of purges gases that may be used $N_2$, Ar, He, $H_2$, combinations thereof, or other nonreactive or inert gas or gas combinations known and used for such purpose. The purging of the second step is generally conducted for about 10–100 msec.

After completion of the second step, in a third step, valve seat 34r is opened to introduce a pulse of reactant B. At the termination of the third step, in a fourth step, valve seat 34r is closed and valve seat 34p and/or valve seat 32p is opened to purge the flow pathways 34a and/or 32a. Preferably both valve seat 34p and valve seat 32p are open to purge their associated flow paths. The time for carrying out the fourth step may not be the same as that for carrying out the second step due to the existence of different species/by-products to be removed after completion of step three. Upon completion of the purge during the fourth step, valve seat 32r is opened to start the first step of the next cycle. As noted above, the cycle is repeated until a sufficient number of layers have been deposited to achieve the desired thickness of the layer being deposited.

Valves 32 and 34 may be operated in other positions. For example, valve seat 32p and/or valve seat 34p may remain open to provide a continuous flow of a purge gas into the chamber in which pulses of the reactant gas A and reactant gas B are dosed into the stream of the purge gas.

In addition to mounting the valves 32 and 34 to the lid 30 so as to minimize the amount of dead volume remaining in the flow paths of the chamber lid area (e.g., the length of pathways 32a and 34a) it is also desirable to provide valves with a minimum of dead volume within the valve mechanisms themselves (i.e., between the inputs of reactants and purge gases and the output that directs these gases to the chamber lid 30). Such valves are known as ZDV valves or zero dead volume valves and further reduce the amounts of gases needed to be flowed through the system for reacting as well as for purging. A "zero dead volume" valve is a valve in which valve seats are situated very close to the gland of the valve, so that very little purging is necessary. For example, the valve seat 32p and/or valve seat 34p is position in close proximity to the valve seat 32r and/or valve seat 32r to reduce the amount of "Dead Volume" in the line to be purged. A zero dead volume valve has negligible dead volume (i.e. not necessary zero dead volume.)

The zero dead volume aspect of these valves decreases processing times by decreasing the amount or volume of a gas that must be pumped in any given step. To further decrease processing times, valves are chosen to have a fast response time or valve cycle time, where a response time or valve cycle time is defined as the time it takes to reposition a valve from one to another of the above-described three positions.

Currently, pneumatic valves having a valve cycle time of about 1–2 seconds (such as those available from Variflo in Richmond, Calif.) may be used. Alternatively solenoid driven valves such as those available from Swagelok (Sunnyvale, Calif.) may be used. With the use of MEMS technology (i.e., micro electro-mechanical system), available from Redwood Microsystems, Inc. (Menlo Park, Calif.), the valve cycle times of these valves can be reduced to about 200–300 msec or less. To further speed up the valve cycle time piezo driven valves, such as those supplied by Horiba/Stec or Fujikin (Fujikin of America, Inc., Santa Clara, Calif.) may be used. Used with MEMS technology control, these valves exhibit valve cycle times of about 100 msec or less.

While the foregoing is directed to embodiments of the present invention, other and further embodiments of the invention may be devised without departing from the basic scope thereof, and the scope thereof is determined by the claims that follow.

What is claimed is:

1. A method of reducing an amount of time needed to form a film on a substrate by atomic layer deposition, the method comprising:

positioning the substrate on a support in a reaction chamber; and establishing a virtual shower curtain between the support and walls of the reaction chamber, thereby dividing the reaction chamber into an upper volume above the support and the virtual shower curtain, and a lower volume, below the support and the virtual shower curtain; and distributing a reactant into the upper volume, wherein the virtual shower curtain restricts the reactant from flowing into the lower volume.

2. The method of claim 1, wherein the distributing is initiated by turning on a valve connecting a source of the reactant with the reaction chamber, the valve being turned on in less than about 400 msec.

3. The method of claim 2, wherein the valve is turned on in about 100 msec.

4. The method of claim 1, wherein the distributing comprises flowing the reactant through a showerhead having at least one distribution hole having a diameter of at least ⅛".

5. The method of claim 4, wherein the showerhead has a plurality of distribution holes each having a diameter of about ⅛" to ⅜".

6. The method of claim 1, wherein the establishing a virtual shower curtain is accomplished by performing a bottom purge of the support.

7. An apparatus for forming a layer on a substrate, comprising:

a chamber lid; and two or more valves mounted to the chamber lid, the two or more valves adapted to provide pulses of reactants.

8. The apparatus of claim 7, wherein each of the valves are connected to separate reactant sources.

9. The apparatus of claim 7, wherein each of the valves are connected to a common purge gas source.

10. The apparatus of claim 7, wherein the two or more valves are adapted to simultaneously deliver a purge gas.

11. The apparatus of claim 7, wherein the valves are zero dead volume valves.

12. The apparatus of claim 7, wherein each of the valves are selected from the group including pneumatic valves, solenoid valves, and piezo-pilot valves.

13. The apparatus of claim 7, wherein each of the valves are MEMS controlled valves.

14. An apparatus for forming a layer on a substrate by atomic layer deposition, comprising:

a chamber and a lid, the lid capable of sealing the chamber to define a reaction chamber therein;

a support including a pedestal having a top surface adapted to support the substrate, wherein a first volume in the reaction chamber is defined on one side of the top surface and a second volume is defined on an opposite of the top surface; and at least one port through which a vacuum may be applied, where upon application of vacuum to at least one port, a bottom purge of the support is performed and a virtual shower curtain is established between the pedestal and the chamber to restrict flow from the first volume to the second volume.

15. The apparatus of claim 14, further comprising a showerhead mounted to the lid.

16. The apparatus of claim 15, wherein the showerhead comprises holes for distributing gas therethrough to the substrate, the holes having a diameter of about ⅛" to ⅜".

17. The apparatus of claim 16, wherein the showerhead comprises spacers thereon to prevent a fluid-tight seal with the lid, wherein upon mounting the showerhead to the lid, a gap is formed therebetween defining horizontal pathways for peripheral distribution of gas from the showerhead.

18. The apparatus of claim 15, wherein the showerhead comprises spacers thereon to prevent a fluid-tight seal with the lid, wherein upon mounting the showerhead to the lid, a gap is formed therebetween defining horizontal pathways for peripheral distribution of gas from the showerhead.

19. The apparatus of claim 15, wherein the showerhead comprises a single gas distribution bore.

20. The apparatus of claim 14, further comprising a pair of gas valves mounted immediately adjacent the lid to minimize dead volume in flow paths connecting the valves with the reaction chamber.

21. The apparatus of claim 20, wherein the valves are mounted flush against the lid.

22. The apparatus of claim 21, wherein the valves are threaded into the lid.

23. The apparatus of claim 21, wherein the valves are welded into the lid.

24. The apparatus of claim 20, wherein the valves are zero dead volume valves.

25. The apparatus of claim 20, wherein the valves are pneumatic valves.

26. The apparatus of claim 20, wherein the valves are solenoid valves.

27. The apparatus of claim 20, wherein the valves are piezo valves.

28. The apparatus of claim 20, further comprising micro electro-mechanical system controlled valves.

29. An apparatus for forming a layer on a substrate by atomic layer deposition, the apparatus comprising:
- a chamber and a lid, the lid capable of sealing with the chamber to define a reaction chamber therein;
- a showerhead mounted to the lid and having at least one hole having a diameter of at least about 1/8" for distributing gas therethrough and into the reaction chamber;
- a support including a pedestal having a top surface adapted to support the substrate, wherein a first volume in the reaction chamber is defined on one side of the top surface and a second volume is defined on an opposite of the top surface; and
- at least one port through which a vacuum may be applied, where upon application of vacuum to at least one port, a bottom purge of the support is performed and a virtual shower curtain is established between the pedestal and the chamber to restrict flow from the first volume to the second volume.

30. The apparatus of claim 29, further comprising fast cycle valves mounted on top of the lid and fluidly connected with the showerhead, the valves each having a valve cycle time of less than about 400 msec.

31. The apparatus of claim 30, wherein the valves each have a cycle time of about 100 msec.

32. An chamber for forming a layer on a substrate, comprising:
- chamber walls;
- a substrate support disposed within the chamber walls, the substrate support having a substrate receiving surface;
- a showerhead disposed over the substrate support and adapted to deliver one or more reactants and one or more purge gases; and
- a reaction zone comprising a volume between the showerhead, the substrate support, and the chamber walls.

33. The apparatus of claim 32, further comprising a gap between the substrate support and the chamber walls.

34. The apparatus of claim 33, further comprising a bottom purge gas port below the substrate support, the bottom purge gas port adapted to deliver a bottom purge gas between the gap between the substrate support and the chamber walls.

35. The apparatus of claim 34, wherein the bottom purge gas port is adapted to deliver a bottom purge gas to limit flow of reactants and purge gases from the showerhead below the substrate support.

36. The apparatus of claim 32, wherein the substrate receiving surface is adapted to receive a 300 mm substrate and wherein the volume of the reaction zone is less than about 2.25 liters.

37. The apparatus of claim 36, wherein the volume of the reaction zone is less than 1.35 liters.

38. The apparatus of claim 32, wherein the substrate receiving surface is adapted to receive a 200 mm substrate and wherein the volume of the reaction zone is less than about 1.0 liters.

39. The apparatus of claim 38, wherein the volume of the reaction zone is less than about 0.6 liters.

* * * * *